United States Patent

Black et al.

Patent Number: 6,119,325
Date of Patent: Sep. 19, 2000

[54] HIGH PRESSURE WATER STREAM TO SEPARATE A MULTI-LAYER INTEGRATED CIRCUIT DEVICE AND PACKAGE

[75] Inventors: J. Courtney Black, San Jose; Richard C. Blish, II, Saratoga, both of Calif.

[73] Assignee: Advanced Micro Devices, Inc., Sunnyvale, Calif.

[21] Appl. No.: 09/199,889

[22] Filed: Nov. 24, 1998

[51] Int. Cl.[7] .................................................. H01L 21/44
[52] U.S. Cl. ....................... 29/426.1; 29/426.4; 29/426.5; 29/762; 438/4; 438/15; 438/460
[58] Field of Search .................................. 438/4, 14, 15, 438/460, 462, 464, 613, 616; 29/239, 762, 426.1, 426.2, 426.3, 426.4, 426.5, 846; 83/24, 22, 98, 99, 177; 216/52, 102

[56] References Cited

U.S. PATENT DOCUMENTS

| | | | |
|---|---|---|---|
| 5,206,181 | 4/1993 | Gross | 438/15 |
| 5,480,503 | 1/1996 | Casey et al. | 438/460 |
| 5,888,884 | 3/1999 | Wojnarowski | 438/460 |
| 5,895,230 | 4/1999 | Bartley | 438/4 |
| 5,904,489 | 5/1999 | Khosropour et al. | 438/15 |
| 5,919,713 | 7/1999 | Ishii et al. | 438/460 |
| 5,930,599 | 7/1999 | Fujimoto et al. | 438/113 |
| 5,989,474 | 11/1999 | Suzuki | 264/400 |

*Primary Examiner*—Donald L. Monin, Jr.
*Assistant Examiner*—Michael Dietrich
*Attorney, Agent, or Firm*—Sawyer Law Group LLP

[57] ABSTRACT

Aspects for device and package separation of a multi-layer integrated circuit device attached at a frontside to an integrated circuit package are described. In an exemplary method aspect, the method includes slicing through material coupling the multi-layer integrated circuit to the integrated circuit package with a high power water stream. The slicing further includes cutting through solder bump material. Additionally, the multi-layer integrated circuit device is utilized for device analysis from a frontside following separation from the integrated circuit package by the step of slicing.

14 Claims, 1 Drawing Sheet

HIGH PRESSURE WATER STREAM TO SEPARATE A MULTI-LAYER INTEGRATED CIRCUIT DEVICE AND PACKAGE

FIELD OF THE INVENTION

The present invention relates to multi-layer integrated circuit (IC) devices, and more particularly to package separation of multi-layer IC devices attached at a frontside to the packages.

BACKGROUND OF THE INVENTION

For multi-layer IC devices coupled at a frontside to device packaging, e.g., oriented in a flip-chip orientation, debugging for defects in the IC is difficult due to having to approach the desired layers from the backside of the device. FIG. 1 illustrates a sideview block diagram of a typical flip-chip configuration. As shown in FIG. 1, an IC device 10 is coupled to a ceramic package 12 (e.g., a C4 package) via solder bumps 14. The solder bumps 14 act as chip-to-carrier interconnects to attach the IC device 10 to the ceramic package 12 and to mate with corresponding pad patterns to form the necessary electrical contacts between the circuit(s) of the IC device 10 and pins of the package 12.

Testing of the circuit remains a challenge due to the upside-down nature of the flip-chip orientation. While the circuit may be approached through the backside layers, such techniques are usually not preferred due to the difficulties associated with having to access the layers in an unconventional order. Further, these techniques normally reduce the thickness of the device to reach the circuit, making the device extremely fragile and cumbersome to handle and utilize during testing.

Accordingly, a need exists for an efficient and effective procedure for separating an IC device from its package to allow utilization, such as testing, from a frontside. The present invention addresses such a need.

SUMMARY OF THE INVENTION

The present invention provides for device and package separation of a multi-layer integrated circuit device attached at a frontside to an integrated circuit package. In an exemplary method aspect, the method includes slicing through material coupling the multi-layer integrated circuit to the integrated circuit package with a high power water stream. The slicing further includes cutting through solder bump material. Additionally, the multi-layer integrated circuit device is utilized for device analysis from a frontside following separation from the integrated circuit package by the step of slicing.

Through the present invention, more efficient device and package separation are achieved. With the separation techniques of the present invention, access to a frontside of a device more readily occurs with less risk of device damage during package removal, with the separation technique requiring a minimal number of steps. Subsequent device analysis from the frontside can readily occur. These and other advantages of the aspects of the present invention will be more fully understood in conjunction with the following detailed description and accompanying drawings.

DETAILED DESCRIPTION

The present invention relates to a procedure for separation of multi-layer integrated circuit coupled at a frontside to device packaging. The following description is presented to enable one of ordinary skill in the art to make and use the invention and is provided in the context of a patent application and its requirements. Various modifications to the preferred embodiment and the generic principles and features described herein will be readily apparent to those skilled in the art.

Figure 1:
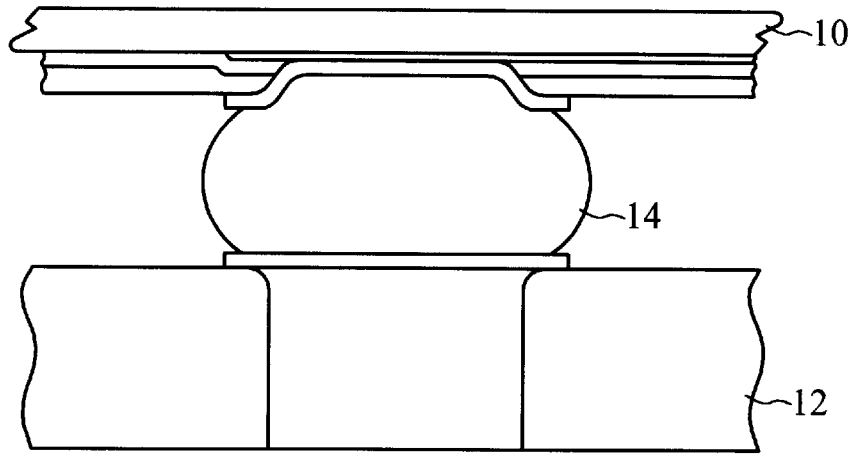
FIG. 1 illustrates a sideview diagram of a typical flip-chip multi-layer integrated circuit.
Figure 2:
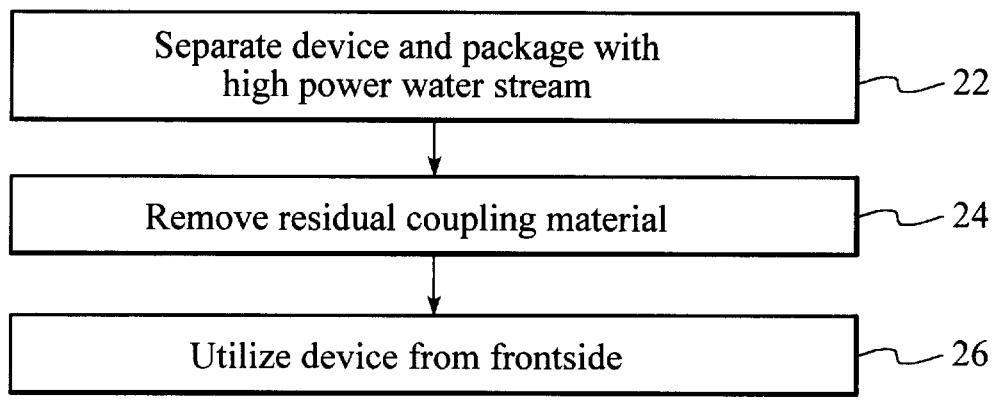
FIG. 2 illustrates a flow diagram of a procedure for separation of a multi-layer integrated circuit from its package in accordance with the present invention.
Figure 3:
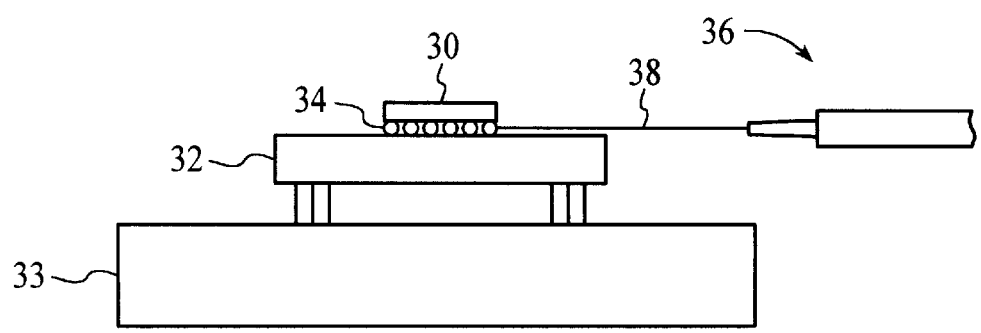
FIG. 3 illustrates a multi-layer integrated circuit arrangement during the procedure illustrated in FIG. 2.

FIG. 2 illustrates a block flow diagram of a process for device and package separation in accordance with a preferred embodiment of the present invention. The process initiates with separation of the device and package using a high-power, precision pressure water stream to cut through the material coupling the device to the package (step 22). FIG. 3 illustrates a device 30 coupled to a package 32 via solder bumps 34. Commonly, underfill material (not shown), e.g., polymer material, is also provided between the device 30 and package 32 to add rigidity to the structure by substantially surrounding the solder bumps 34. Thus, the separating occurs through the coupling material of solder bumps 34 and underfill material for the configuration of FIG. 3. FIG. 3 further illustrates a spray device 36 with a narrow, high-precision water stream 38. Preferably, the device 30 and package 32 are configured such that separation can more readily occur. By way of example, the device 30 and package 32 are configured on a support structure 33 that can hold the device 30 securely and allow the stream 38 to move along the device 30 and package 32 during cutting. Alternatively, the device 30 and package 32 could be driven, as needed, in any direction. The steady, high pressure stream 38 thus is readily provided to all of the coupling material 34 as it moves past the device 30 and package 32.

By way of example, preferred conditions for supplying the water stream include high pressure for approximately one minute for a K6 device from Advanced Micro Devices of Sunnyvale, Calif., with an approximate distance of one centimeter from the nozzle to the coupling material. Of course, these conditions are meant as illustrative of those suitable for current coupling material and device conditions. Other conditions may be suitable for other design needs, as is well appreciated by those skilled in the art. However, the conditions chosen suitably provide sufficient precision to break through the coupling material without harming the device 30.

With the use of the high pressure stream to slice through the coupling material, the device 30 and package 32 are successfully separated. Any residual coupling material still on the device 30 may then be removed (step 24), using standard solder/underfill removal techniques, such as through mechanical polishing. The device 30 is then suitably utilized as desired (step 26), for example to perform device analysis and debugging from a frontside using well-established, standard analysis techniques.

Although the present invention has been described in accordance with the embodiments shown, one of ordinary skill in the art will recognize that there could be variations to the embodiment and those variations would be within the spirit and scope of the present invention. The technique of using the water stream could be extended for utilization in cross-section the device. Accordingly, many modifications may be made by one of ordinary skill without departing from the spirit and scope of the present invention, the scope of which is defined by the following claims.

What is claimed is:

1. A method for device and package separation of a multi-layer integrated circuit device mounted at a frontside to an integrated circuit package, the method comprising:

slicing through material coupling the multi-layer integrated circuit to the integrated circuit package by cutting through solder bump material with a high power water stream.

2. The method of claim 1 wherein cutting through solder bump material further comprises cutting through underfill material substantially surrounding the solder bump material.

3. A method for device and package separation of a multi-layer integrated circuit device mounted at a frontside to an integrated circuit package, the method comprising:

slicing through material coupling the multi-layer integrated circuit to the integrated circuit package with a high power water stream; and removing residual coupling material from the multi-layer integrated circuit device after the step of slicing.

4. The method of claim 3 wherein removing residual coupling material further comprises mechanically polishing the residual coupling material from the multi-layer integrated circuit device.

5. A method for device and package separation of a multi-layer integrated circuit device mounted at a frontside to an integrated circuit package, the method comprising:

slicing through material coupling the multi-layer integrated circuit to the integrated circuit package with a high power water stream; and utilizing the multi-layer integrated circuit device for device analysis from the frontside following separation from the integrated circuit package by the step of slicing.

6. A multi-layer integrated circuit device arrangement comprising:

an integrated circuit package;

a multi-layer integrated circuit device coupled to the integrated circuit package at a frontside through predetermined coupling material comprising solder bump material; and a sprayer for providing a high power water stream through the predetermined coupling material to separate the multi-layer integrated circuit device from the integrated circuit package and allow access to the frontside of the multi-layer integrated circuit device.

7. The arrangement of claim 6 wherein the predetermined coupling material further comprises underfill material substantially surrounding the solder bump material.

8. The arrangement of claim 6 wherein the integrated circuit package comprises a C4 package.

9. The arrangement of claim 6 further comprising a support structure, the support structure holding the integrated circuit package and the multi-layer circuit device during separation and allowing the water stream to penetrate through all of the coupling material.

10. A method for accessing a multi-layer integrated circuit device oriented in a flip-chip orientation from a frontside, the method comprising:

separating the multi-layer integrated circuit device coupled through solder bump material at the frontside to a flip-chip package by a high power water stream;

removing residual solder bump material from the multi-layer integrated circuit device; and utilizing the multi-layer integrated circuit device from the frontside.

11. The method of claim 10 wherein separating further comprises cutting through underfill material substantially surrounding the solder bump material.

12. The method of claim 11 wherein removing residual solder bump material further comprises removing residual underfill material.

13. The method of claim 10 wherein removing residual solder bump material further comprises mechanically polishing the solder bump material.

14. The method of claim 10 wherein utilizing the multi-layer integrated circuit device from a frontside further comprises performing device analysis from the frontside.

* * * * *